United States Patent
Wu et al.

(10) Patent No.: US 7,444,122 B2
(45) Date of Patent: Oct. 28, 2008

(54) COMMUNICATIONS SYSTEM WITH VARIABLE LOAD AND RELATED METHOD

(75) Inventors: Pi-An Wu, Taipei Hsien (TW); Sen-You Liu, Taipei Hsien (TW)

(73) Assignee: VIA Technologies Inc., Hsin-Tien, Taipei Hsien (TW)

( * ) Notice: Subject to any disclaimer, the term of this patent is extended or adjusted under 35 U.S.C. 154(b) by 141 days.

(21) Appl. No.: 11/669,161

(22) Filed: Jan. 31, 2007

(65) Prior Publication Data

US 2008/0012648 A1    Jan. 17, 2008

Related U.S. Application Data

(60) Provisional application No. 60/746,990, filed on May 11, 2006.

(51) Int. Cl.
*H04B 1/04* (2006.01)
(52) U.S. Cl. ...................... 455/119; 455/123
(58) Field of Classification Search ......... 455/119–125; 331/16, 74–77
See application file for complete search history.

(56) References Cited

U.S. PATENT DOCUMENTS 6,658,239 B1 * 12/2003 Elder et al. ............ 455/121

* cited by examiner

*Primary Examiner*—David Mis
(74) *Attorney, Agent, or Firm*—Winston Hsu

(57) ABSTRACT

A mobile system has a frequency synthesizer and an amplifier module coupled to the frequency synthesizer. The frequency synthesizer is controlled by frequency division data to generate a tuning signal with a frequency corresponding to a reference signal and the frequency division data. The mobile system provides an input signal based on the frequency of the tuning signal having a frequency spectrum corresponding to the frequency of the tuning signal. The amplifier module has a variable load circuit for providing an equivalent impedance, an amplifier circuit coupled to the variable load circuit for establishing an output signal corresponding to the input signal and the equivalent impedance of the variable load circuit, and a mapping circuit for modifying the equivalent impedance of the variable load circuit based on the frequency division data.

11 Claims, 7 Drawing Sheets

COMMUNICATIONS SYSTEM WITH VARIABLE LOAD AND RELATED METHOD

CROSS REFERENCE TO RELATED APPLICATIONS

This application claims the benefit of U.S. Provisional Application No. 60/746,990, filed on May 11, 2006 and entitled "Amplification Circuit/Communication Circuit and Related Method," the contents of which are incorporated herein by reference.

BACKGROUND OF THE INVENTION

1. Field of the Invention

The present invention relates to communications systems and a mobile system, and more particularly, to a wideband communications system and a mobile system with a variable load circuit whose impedance corresponds to a frequency division factor of a frequency synthesizer.

2. Description of the Prior Art

Generally speaking, when transmitting data in a communications system, the communications system (mobile system) will perform modulation on data pending transmission to form a corresponding pending transmission signal. Then, the communications system will utilize an amplifier circuit to perform power amplification on the pending transmission signal before sending the pending transmission signal out. Please refer to FIG. 1, which is a circuit diagram of a tuned amplifier 10 according to the prior art. The tuned amplifier 10 is biased from a direct current (DC) voltage V to ground G, and comprises an n-type metal-oxide-semiconductor (NMOS) transistor M0 that realizes the amplification function and is coupled to a load circuit 12 comprising a capacitor Cp and an inductor Lp that form an LC-tank, and a resistor Rp. The equivalent impedance of the load circuit 12 is dependent on the operating frequency of the tuned amplifier 10. The gate of the NMOS transistor M0 is utilized to receive an input signal Si, e.g. the pending transmission signal, and the drain of the NMOS transistor M0 is utilized to output an amplified output signal So that is generated by the current conducted between the drain and the source of the NMOS transistor M0 flowing through the load circuit 12.

Please refer to FIG. 2, which is a diagram of the equivalent impedance of the load circuit 12 in accordance with the operating frequency of the tuned amplifier 10. The horizontal axis in FIG. 2 represents frequency, and the vertical axis in FIG. 2 represents the magnitude of the equivalent impedance. The equivalent impedance provided by the LC-tank exhibits a bandpass characteristic over the frequency spectrum. The bandpass characteristic can be described by resonant frequency and quality factor Q. The resonant frequency decides the position of the bandpass characteristic in the frequency spectrum, whereas the quality factor Q reflects bandwidth and gain of the bandpass characteristic. Changing the capacitance value of the capacitor Cp and the inductance value of the inductor Lp changes the resonant frequency and the quality factor Q of the bandpass characteristic, likewise changing the bandpass characteristic over the frequency spectrum. FIG. 2 shows different bandpass characteristics resulting from different quality factors Q. As shown in FIG. 2, when the capacitor Cp and the inductor Lp of the LC-tank combine to give the load circuit 12 a relatively high quality factor Q, the gain of the equivalent impedance is also relatively high. On the other hand, the relatively high quality factor Q results in a relatively narrow bandwidth. Likewise, if the capacitor Cp and the inductor Lp of the LC-tank combine to form a relatively low quality factor Q, then the bandwidth of the bandpass characteristic will be relatively wide, but the impedance will be reduced. If the impedance of the load circuit 12 is low, then the overall power gain of the tuned amplifier 10 will be reduced, making the tuned amplifier 10 unsuitable for signal power amplification.

Please refer to FIG. 3, which is a diagram of different equivalent impedances provided by the load circuit 12 at different frequencies. The horizontal axis in FIG. 3 represents frequency, and the vertical axis in FIG. 3 represent equivalent impedance magnitude. In FIG. 3, assume that frequencies f0 and f1 individually represent two center frequencies of two different frequency channels, respectively, and that the power amplification provided by the tuned amplifier 10 at each frequency f0, f1 is determined by the equivalent impedances provided by the load circuit 12 at each frequency f0, f1. As shown in FIG. 3, if the capacitor Cp and the inductor Lp of the LC-tank combine to give the load circuit 12 a relatively high quality factor Q, the equivalent impedance of the load circuit 12 will have a narrower bandwidth. This represents that the bandpass characteristic of the equivalent impedance will have high frequency selectivity, and the equivalent impedances provided at different frequencies will be very different. In other words, if the load circuit 12 has a high quality factor Q, the load circuit 12 will be unable to provide similar equivalent impedance at the frequencies of different frequency channels. In turn, the tuned amplifier 10 will also be unable to provide similar power gain for the pending transmission signal Si for different frequency channels.

In contrast, if the capacitor Cp and the inductor Lp of the LC-tank combine to give the load circuit 12 a relatively low quality factor Q, the equivalent impedance of the load circuit 12 will have a wider bandwidth, meaning the frequency selectivity will be reduced. The equivalent impedance provided at different frequencies will also be more even. However, as shown in FIG. 2, the lower quality factor Q causes the equivalent impedance of the load circuit 12 to be lower, which is a disadvantage for signal power amplification.

In order to increase multiplexing efficiency of data transmission, different members of different network systems can use signals in different frequency channels to exchange data. For example, wireless networks under the IEEE 803.11 a standard separate the 1 GHz frequency band into multiple different frequency channels, and each frequency channel occupies a different frequency range. In order to satisfy the communications requirements of this multi-channel specification, amplifiers in mobile systems should be able to provide similar power gain across a wide range of channel frequencies for the pending transmission signals. However, the tuned amplifier 10 of the prior art is formed of the fixed-value capacitor Cp and the fixed-value inductor Lp, which causes a tradeoff between gain and bandwidth. If the combination of the capacitor Cp and the inductor Lp has a high quality factor Q, then the bandwidth will be sacrificed, which makes it impossible to provide similar power gain for the pending transmission signal at different channel frequencies. If the combination of the capacitor Cp and the inductor Lp has a low quality factor Q, then the gain will be sacrificed, and it will be impossible to provide optimum power gain. Thus, it is hard for the fixed-LC tank tuned amplifier of the prior art mobile system to meet both power gain and bandwidth requirements.

SUMMARY OF THE INVENTION

According to the present invention, a communications system comprises a frequency synthesizer controlled by frequency division data for providing a tuning signal having a frequency corresponding to a frequency of a reference signal and the frequency division data, the communications system providing an input signal based on the frequency of the tuning signal having a frequency spectrum corresponding to the frequency of the tuning signal, and an amplifier module coupled to the frequency synthesizer. The amplifier module comprises a variable load circuit for providing an equivalent impedance, an amplifier circuit coupled to the variable load circuit for establishing an output signal corresponding to the input signal and the equivalent impedance of the variable load circuit, and a mapping circuit for modifying the equivalent impedance of the variable load circuit based on the frequency division data.

According to the present invention, a method of tuning and amplifying a communications signal based on an input signal for providing an output signal comprises setting frequency division data, performing a frequency synthesis procedure according to the frequency division data using a reference signal to generate a corresponding tuning signal having a frequency corresponding to a frequency of the reference signal and a value of the frequency division data for corresponding a frequency range of the input signal to the frequency of the tuning signal, performing a mapping procedure according to the value of the frequency division data to provide a corresponding equivalent impedance having a value corresponding to the value of the frequency division data, and performing a tuning and amplification procedure according to the input signal for establishing the output signal on the equivalent impedance.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
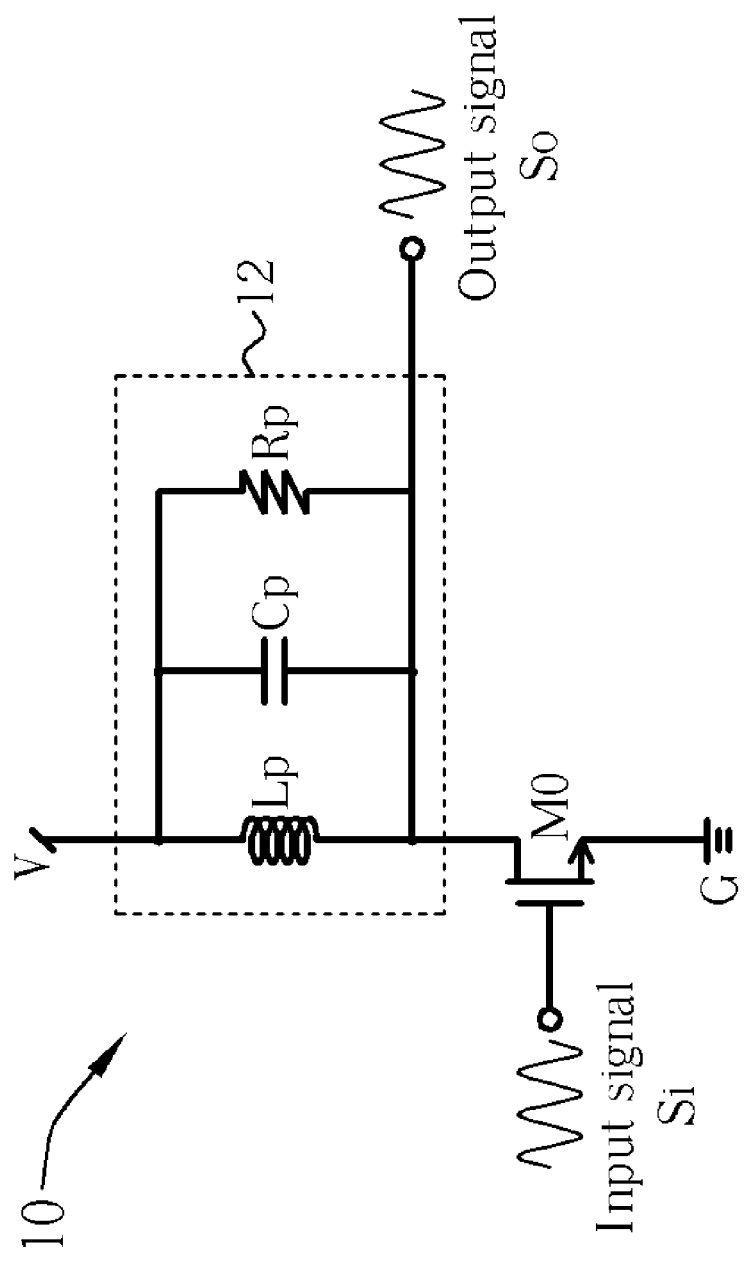
FIG. 1 is a circuit diagram of a tuned amplifier according to the prior art.
Figure 2:
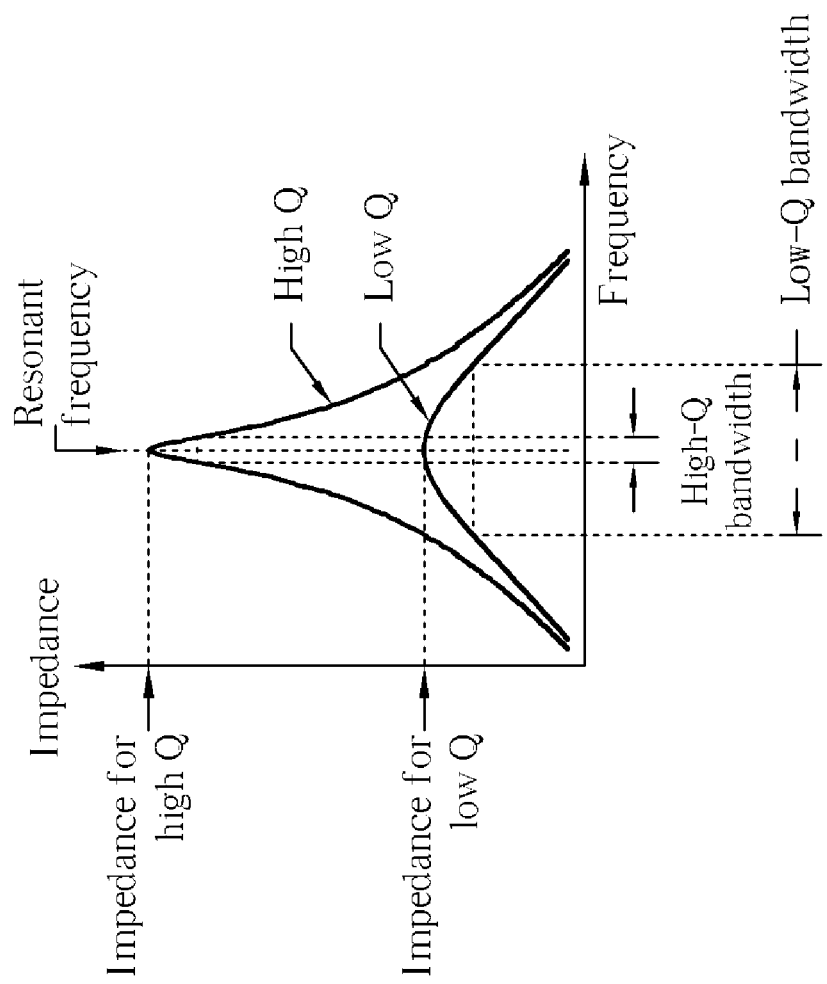
FIG. 2 is a diagram of the equivalent impedance of a load circuit in accordance with the operating frequency of the tuned amplifier.
Figure 3:
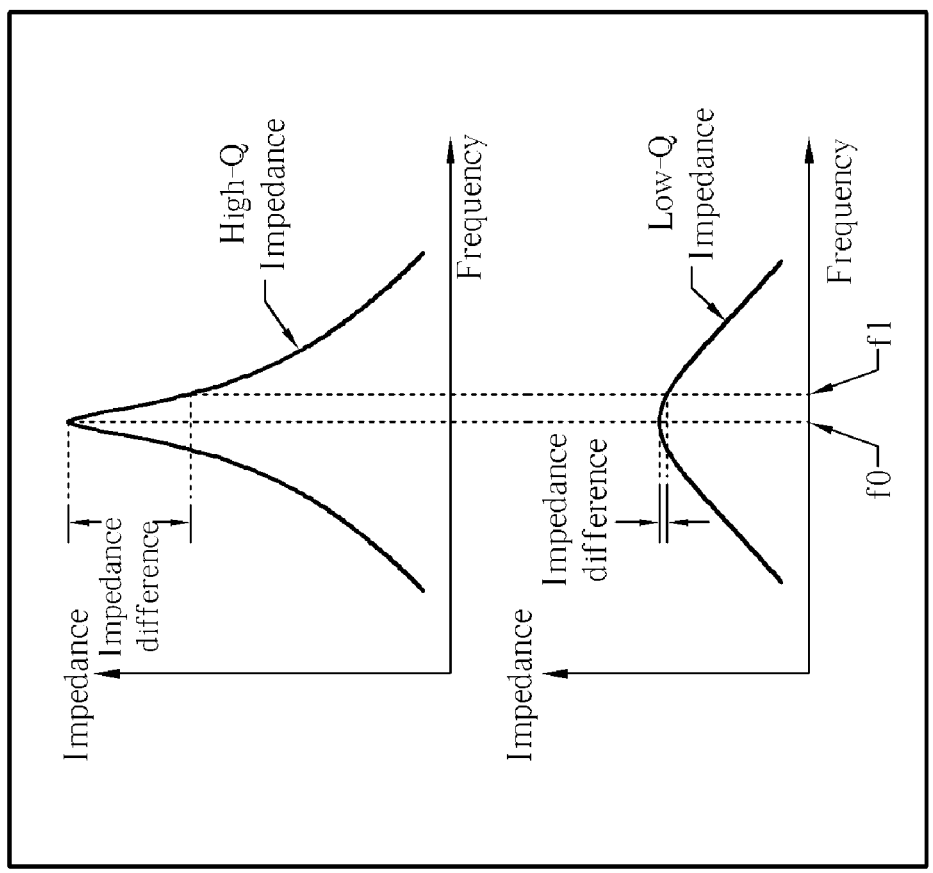
FIG. 3 is a diagram of different equivalent impedances provided by the load circuit at different frequencies.

The present invention is a communications system that uses tuned amplifier having a variable load circuit to provide high gain and wide bandwidth for ensuring similar high power gain over all channels distributed over a large frequency band. Please refer to FIG. 4, which is a functional block diagram of a first embodiment of the communications system 20. The communications system 20 comprises a frequency synthesizer 24 and an amplifier circuit 30, and receives frequency division data N-Data, a clock CLK, and a latch-up signal LE through an interface circuit 26, e.g. a three-wire interface. The interface circuit 26 receives the frequency division data N-Data based on a trigger of the clock CLK to convert the frequency division data N-Data to an Nd-bit (Nd is a constant) frequency division data N-Dt and hold the frequency division data N-Dt according to control of the latch-up signal LE, such that the frequency synthesizer 24 and the amplifier circuit 30 can obtain the frequency division data N-Dt through an Nd-bit bus. The frequency synthesizer 24 uses a constant reference frequency signal Fref to form a tuning frequency Ft according to the frequency division data N-Dt. For example, the frequency synthesizer 24 can determine a multiplication factor N according to the value of the frequency division data N-Dt, and set the tuning frequency Ft to N times the constant reference frequency signal Fref. When the value of the frequency division data N-Dt changes, the frequency synthesizer 24 changes the multiplication factor N accordingly, such that the frequency of the tuning frequency Ft changes with the value of the frequency division data N-Dt. Based on the tuning frequency Ft provided by the frequency synthesizer 24, the communications system 20 can modulate pending transmission data to form a pending transmission signal. A frequency spectrum of the pending transmission signal is carrier modulated to near the frequency of the tuning frequency Ft, so that the frequency spectrum of the pending transmission signal corresponds to the frequency of the tuning frequency Ft. The pending transmission signal can be an input signal Si of the amplifier circuit 30, which the amplifier circuit 30 power amplifies into an output signal So.

Because the frequency division data N-Dt can determine the frequency of the tuning frequency Ft, and the frequency spectrum of the input signal corresponds to the frequency of the tuning frequency Ft, the frequency division data N-Dt can be used to represent the frequency spectrum of the input signal Si. In fact, the frequency division data N-Data (and N-Dt) is used to indicate the frequency channel used for communication to the communication system 20.

Specifically speaking, the frequency synthesizer 24 has a phase-frequency detector PFD, a low-pass filter LPF, a voltage-controlled oscillator VCO, and a 1/N frequency divider 32, which form a phase-locked loop. The voltage-controlled oscillator VCO oscillates at the tuning frequency Ft, and the frequency divider 32 determines the corresponding frequency division factor N based on the frequency division data N-Dt for dividing the tuning frequency Ft. The phase-frequency detector PFD compares the divided tuning frequency and the constant reference frequency signal Fref to detect a difference between their respective frequencies and phases. The low-pass filter LPF provides feedback control to the voltage-controlled oscillator VCO based on a result of the comparison performed by the phase-frequency detector PFD, such that the voltage-controlled oscillator VCO modifies the frequency of the tuning frequency Ft, using the feedback control loop to correct the frequency of the tuning frequency Ft repeatedly, such that the divided frequency of the tuning frequency Ft can be locked to the frequency of the constant reference frequency signal Fref. And thus, the frequency of the tuning frequency Ft equals N times the frequency of the constant reference frequency signal Fref. Changing the frequency division data N-Data (and N-Dt) changes the division factor N of the divider 32, whereby the phase-locked loop can generate different frequencies of the tuning frequency Ft to modulate the pending transmission signal to different frequency channels.

As discussed above, pending transmission signals in different channels are distributed across the wide frequency range. In order to realize the spirit of the present invention of providing similar power gain for the input signal Si across a wide range of frequency channels, the amplifier circuit 30 with the variable load circuit has the amplifier M, the variable load circuit 22, and the mapping circuit 28. The amplifier M provides electrical power (such as current) corresponding to the input signal Si, which electrical power can thereby establish the output signal So after power amplification across the variable load circuit 22. The variable load circuit 22 provides the variable equivalent impedance, and the mapping circuit 28 adjusts the equivalent impedance of the variable load circuit 22 according to the value of the frequency division data N-Dt, such that the equivalent impedance changes with the frequency division data to shift the passband of the equivalent impedance on the frequency range to the frequency spectrum of the input signal Si. In this way, the present invention can provide similar power gain to the input signal Si over different frequency channels without sacrificing power gain.

Figure 4:
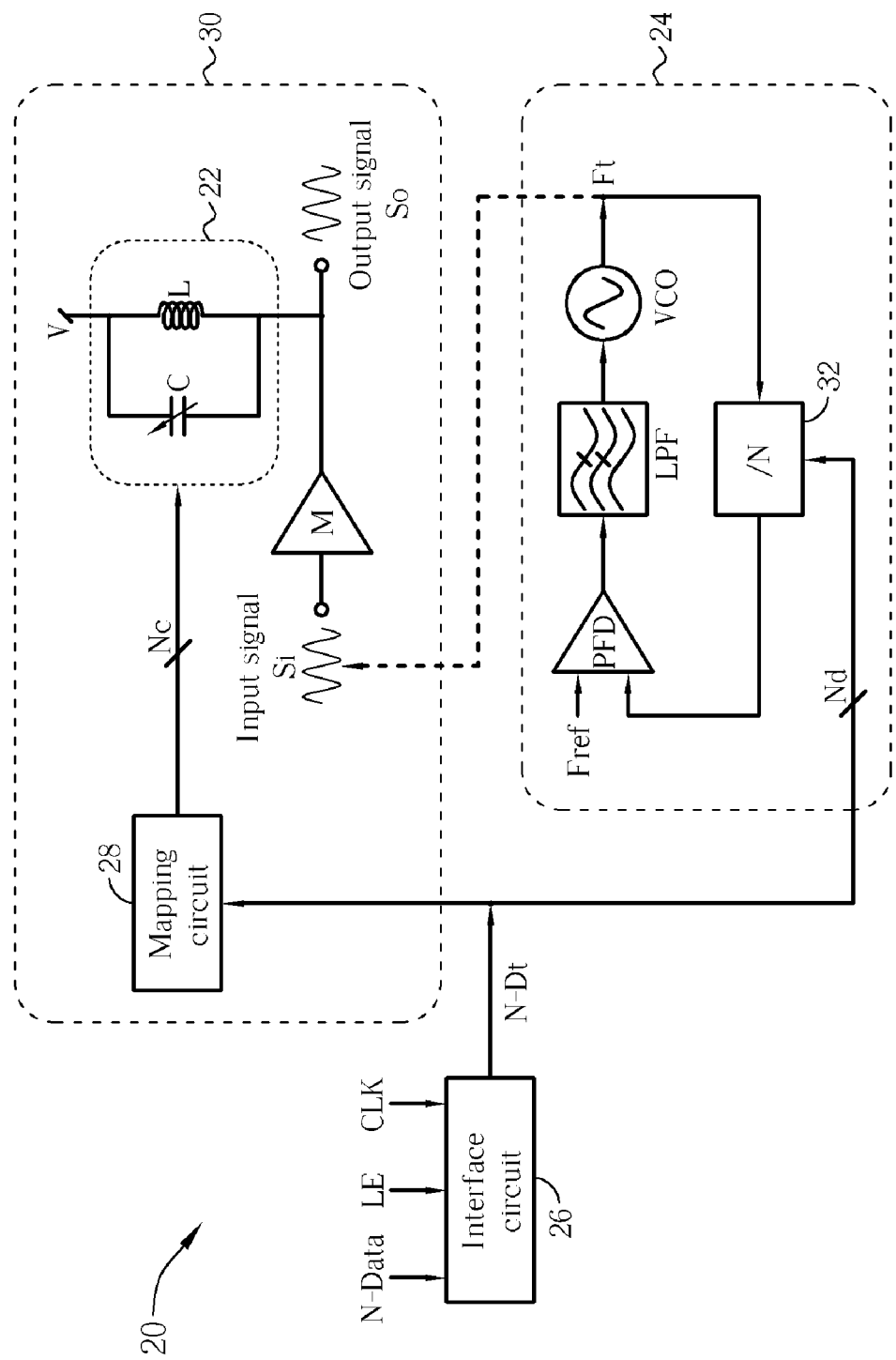
FIG. 4 is a functional block diagram of a first embodiment of the communications system according to the present invention.

As shown in FIG. 4, in one embodiment of the present invention, the variable load circuit 22 uses a variable capacitor circuit C and a constant inductor L to form an LC-tank. The variable capacitor circuit C provides a variable capacitance, and the mapping circuit 28 controls the capacitance provided by the variable capacitor circuit C according to the frequency division data N-Dt, for example controlling the capacitance provided by the variable capacitor circuit C through an Nc-bit bus, such that the resonant frequency (and passband) of the variable load circuit 22 can shift, allowing the passband of the variable load circuit 22 to conform practically with the frequency spectrum of the input signal Si. Generally speaking, the resonant frequency (and passband location) of the LC-tank is inversely proportional to the square root of the product of the capacitance and the inductance. So, by changing the capacitance of the LC-tank, the resonant frequency and location of the passband can be changed. In practice, the present invention mapping circuit 28 comprises a mapping table having preset variable capacitor control modes corresponding to different frequency division data N-Dt values. When the mapping circuit 28 receives frequency division data N-Dt of a particular value, the mapping circuit 28 looks up the value in the mapping table to find the corresponding variable capacitor control mode, and control the variable capacitor circuit C with the appropriate control mode. For example, if the frequency division data N-Dt represents a relatively large frequency division factor N, this indicates that the input signal Si will be modulated to a relatively high frequency spectrum, and the mapping circuit 28 can reduce the capacitance provided by the variable capacitor circuit C accordingly, such that the passband of the variable load circuit 22 shifts to a higher frequency to accommodate the relatively high frequency spectrum input signal Si.

Figure 5:
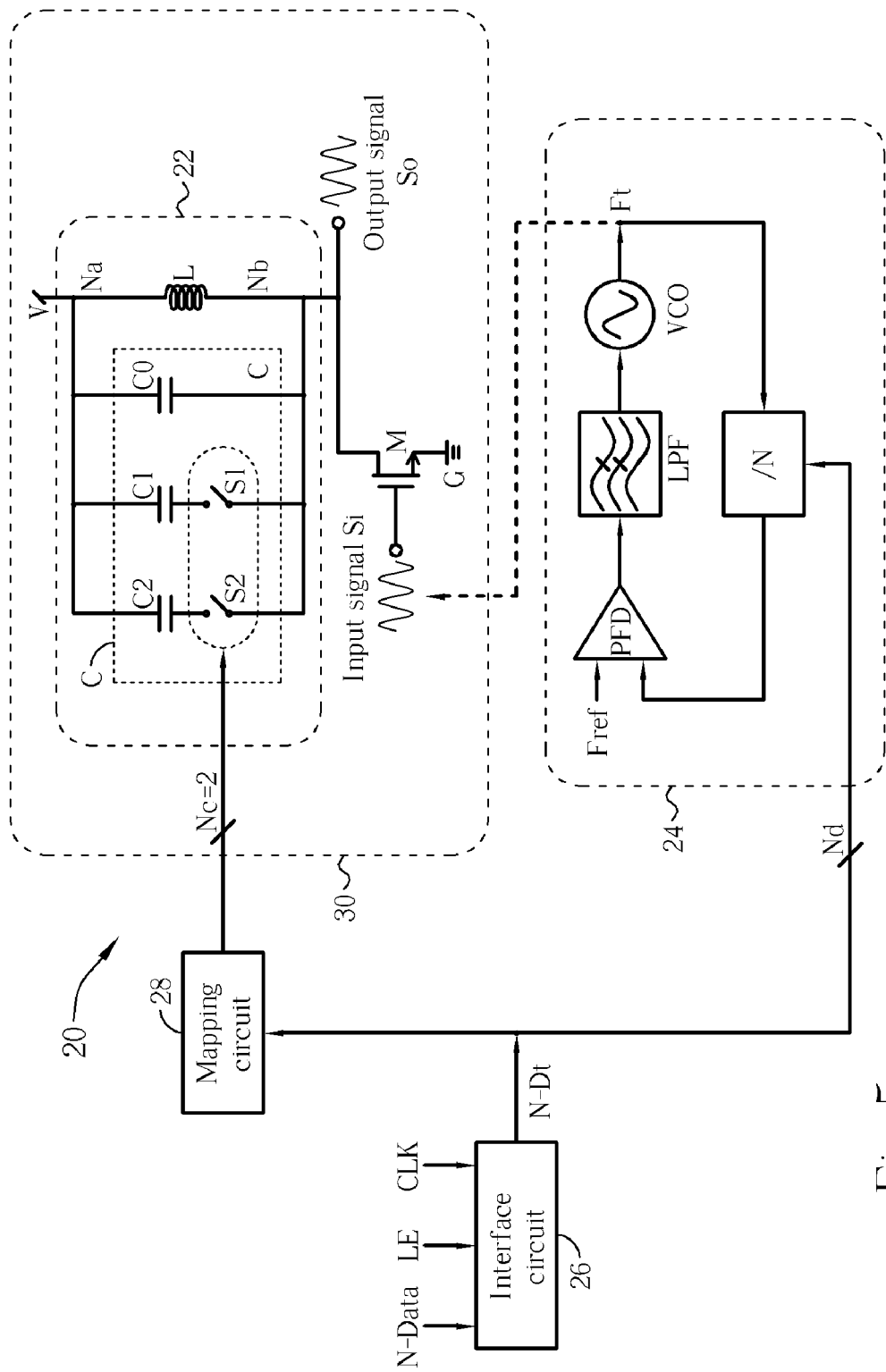
FIG. 5 is a detailed diagram of the communications system of FIG. 4.

Please refer to FIG. 5, which illustrates the communications system 20 of FIG. 4 in greater detail. As shown in FIG. 5, the variable capacitor circuit C can be realized as a plurality of fixed value capacitors C0-C2 coupled to a plurality of corresponding switches S1, S2. Two nodes Na, Nb can be seen as coupling ports of the variable capacitor circuit C, with the capacitors C0-C2 coupled in parallel across the two nodes Na, Nb, such that the variable capacitor circuit C can provide the variable capacitance through the coupling ports. The capacitor C0 provides a default capacitance for the variable capacitor circuit C. The switches S1, S2 respectively correspond to the capacitors C1, C2, and the on-off state of the switches S1, S2 controls whether or not the corresponding capacitors C1, C2 can be coupled to the coupling ports. The mapping circuit 28 can use a 2-bit (Nc=2) signal according to the value of the frequency division data N-Dt to control the state of each switch S1, S2, thereby adjusting the capacitance that can be provided by the variable capacitor circuit C across the nodes Na-Nb. For example, for the mapping circuit 28 to reduce the capacitance provided, the switches S1, S2 can both be turned off, so that the variable capacitor circuit C only provides capacitance through the capacitor C0, which shifts the passband of the variable load circuit 22 to a higher frequency for performing power amplification on the input signal Si over a high frequency channel. Likewise, for the mapping circuit 28 to increase the capacitance provided by the capacitor circuit C, the switches S1, S2 can be turned on selectively. For example, if both of the switches S1, S2 are turned on, the capacitance provided by the variable capacitor circuit C will be the sum of all three capacitors C0, C1, C2, which shifts the passband of the variable load circuit 22 to a lower frequency for performing power amplification on the input signal Si over a low frequency channel. Further, as shown in FIG. 5, the amplifier circuit 30 is biased between a DC voltage V and a ground voltage G. The amplifier M of FIG. 4 could be realized as (but is not limited to) an n-type metal-oxide-semiconductor (NMOS) transistor.

Figure 6:
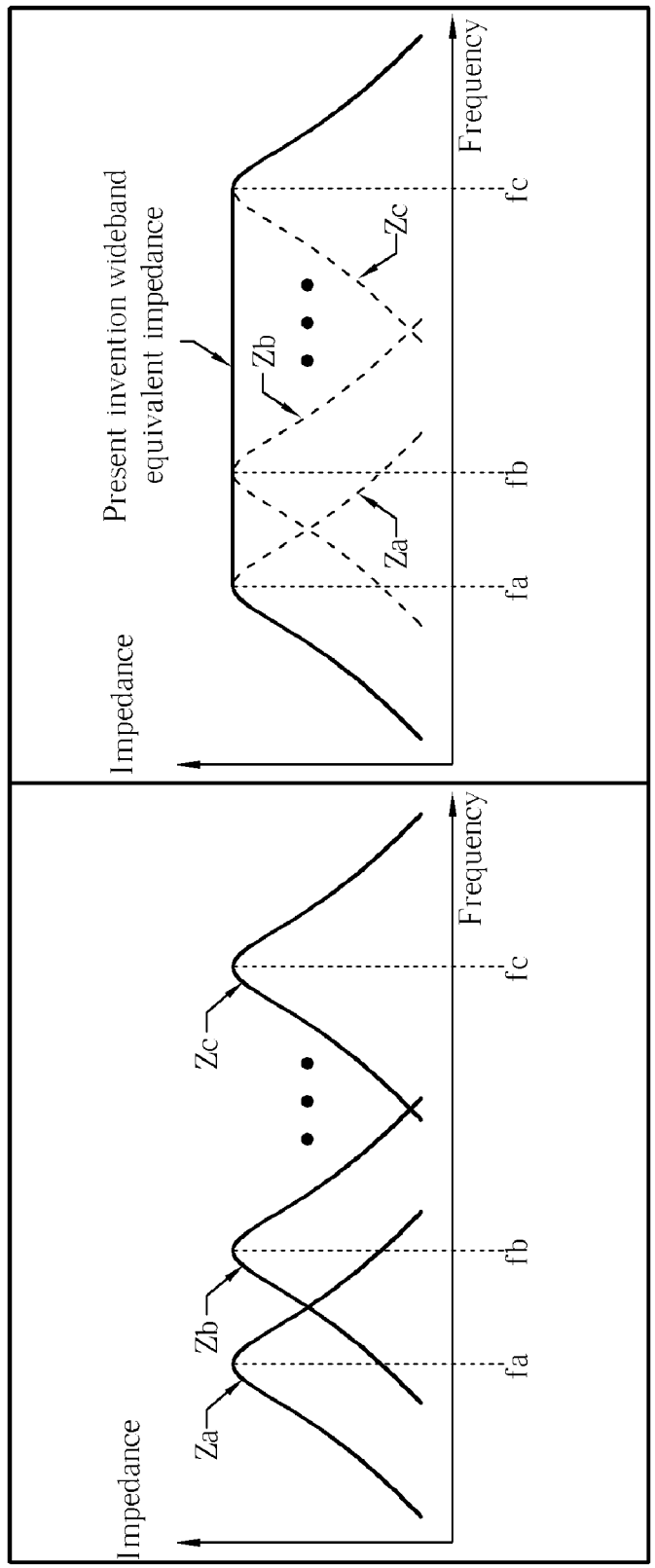
FIG. 6 is a diagram of the amplifier circuit of the present invention utilizing the mapping circuit and the variable load circuit to perform power amplification of input signals Si over different frequency channels.

Please refer to FIG. 6, which is a diagram of the amplifier circuit 30 of the present invention utilizing the mapping circuit 28 and the variable load circuit 22 to perform power amplification of input signals Si over different frequency channels. In FIG. 6, the horizontal axis represents frequency, and the vertical axis represents equivalent impedance. When the frequency division data N-Dt (as shown in FIGS. 4 and 5) causes the tuning frequency Ft synthesized by the frequency synthesizer 24 to be at a frequency fa, the input signal Si of the amplifier circuit 30 will also be adjusted to near the frequency fa, and the mapping circuit 28 can adjust the variable capacitance of the variable load circuit 22 according to the frequency division data N-Dt (for example, by turning on the switches S1, S2 shown in FIG. 5), such that the variable load circuit 22 can provide an equivalent impedance Za (as shown in FIG. 6) on the frequency range, so as to perform power amplification on the input signal Si through the equivalent impedance Za near the frequency fa. Likewise, when the frequency division data N-Dt changes and the tuning frequency Ft synthesized by the frequency synthesizer 24 increases to a frequency fb, it represents that the communications circuit 20 has changed the frequency channel used for communication, and is modulating the pending transmission signal to near the frequency fb. The mapping circuit 28 can use the frequency division data N-Dt to ascertain the change of frequency channel, and adjust the variable load of the variable load circuit 22 accordingly (for example, by turning off either one of the switches S1, S2 to decrease the overall capacitance), such that the variable load circuit 22 can provide the equivalent impedance Zb over the frequency range to accommodate for the input signal Si having a frequency spectrum near the frequency fb.

When the frequency division data N-Dt indicates that the frequency synthesizer 24 is providing a high frequency tuning frequency Ft at a frequency fc, the present invention input signal Si of the amplifier circuit 30 will be modulated to near the frequency fc. The mapping circuit 28 will adjust the variable load circuit 22 accordingly (for example, by turning off both of the switches S1, S2 to further decrease the capacitance of the LC-tank), such that the variable load circuit 22 can provide an equivalent impedance Zc over the frequency range to accommodate the input signal Si at a frequency spectrum near the frequency fc.

Due to the coordinated operation of the mapping circuit 28 and the variable load circuit 22, the present invention communications system 20 can dynamically accommodate the frequency spectrum of the input signal Si to provide similar gain for the input signal Si over different frequency channels. Equivalently, the adjustment control of the variable load circuit 22 by the mapping circuit 28 allows the passband of the equivalent impedance of the variable load circuit 22 to shift along the frequency range, and these shifted equivalent impedance passbands can be combined to form a flat, wideband equivalent impedance. This represents that the present invention amplifier circuit 30 can provide similar power gain for the input signal Si over different frequency bands in a wide frequency range. Because the present invention performs power amplification by shifting the passband, each equivalent impedance Za, Zb, Zc of the present invention can be a high-Q equivalent impedance, so as to provide high power gain. Although the passband of the high-Q equivalent impedance is relatively narrow, the operation of the mapping circuit 28 can ensure that the passband is effectively shifted to the frequency spectrum of the input signal Si to provide similar power gain to the input signal Si over different frequency channels. For this reason also, the present invention can simultaneously meet high power gain and wide bandwidth requirements, unlike the prior art tuned amplifier 10 which encounters a gain-bandwidth tradeoff.

When realizing the present invention, the equivalent impedances Za, Zb, Zc can have appropriate Q values, such that each equivalent impedance can cover a specific number of frequency channels, and the combination of the equivalent impedances can cover even more frequency channels in the wide frequency band. For example, if a particular frequency channel is near a frequency fa', the frequency channel can still be covered by the passband of the impedance Za, and the frequencies fa, fa' can share the same impedance Za. In other words, when the mapping circuit 28 determines from the frequency division data that the tuning frequency is at the frequency fa or the frequency fa', the mapping circuit 28 can set the variable load circuit 22 to provide the equivalent impedance Za. This use of one equivalent impedance for many frequency channels reduces the complexity of the variable load circuit 22, such that the variable load circuit 22 does not have to realize too many equivalent impedances.

Figure 7:
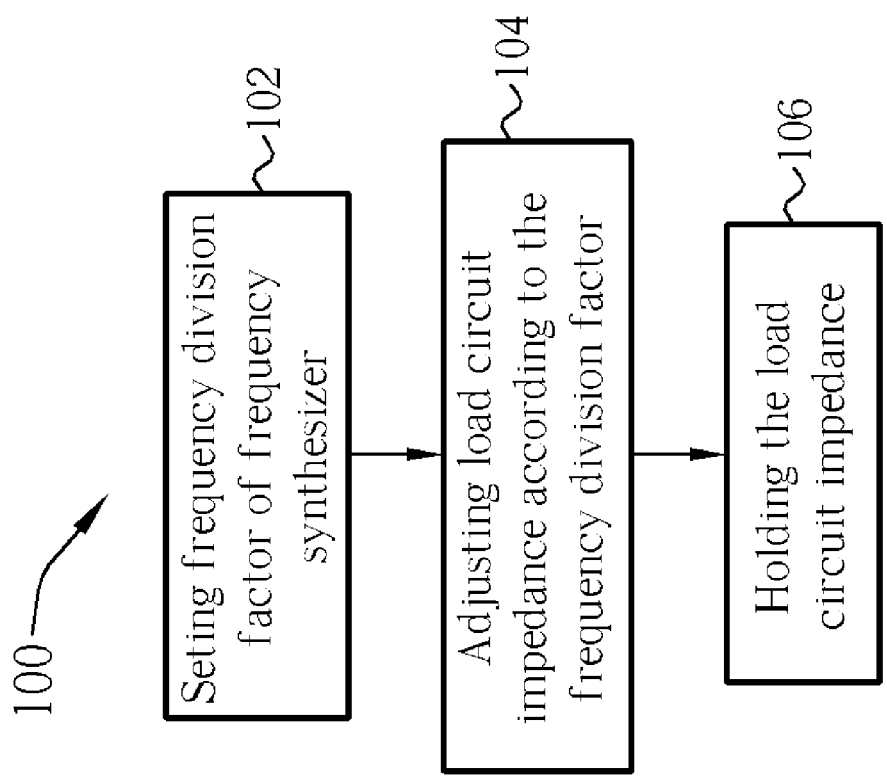
FIG. 7 is a diagram of an operation procedure of the communications system according to the present invention.

Please refer to FIG. 7, which is a diagram of an operation procedure 100 of the communications system 20 according to the present invention. The procedure 100 comprises the following steps:

Step 102: Setting the frequency division factor N of the frequency synthesizer 24 by the frequency division data N-Data, such that the frequency synthesizer 24 provides the tuning frequency at a corresponding frequency.

Step 104: Adjusting the variable load circuit 22 according to the frequency division data, such that the passband of the variable load circuit 22 shifts in the frequency range to accommodate the frequency spectrum of the input signal Si.

Step 106: Holding the impedance of the variable load circuit 22. If the frequency division data N-Data changes, this represents that the frequency channel of the input signal Si changed, and the procedure 100 can repeat Steps 102-106 to readjust the passband of the variable load circuit 22 to accommodate the new frequency channel of the input signal Si.

Actually, repeated performance of the procedure 100 can be controlled to trigger based on the clock CLK and the latch-up signal LE to dynamically and instantaneously reach to changes in the frequency channel of the input signal Si, so as to provide similar power gain to the input signal Si for different frequency channels.

In the embodiment shown in FIGS. 4-7, the present invention is illustrated by means of the frequency synthesizer 24 for describing the operation of the present invention. However, the amplifier circuit 30 can also operate in coordination with other types of frequency synthesizers. The mapping circuit 28 can utilize any signal used to indicate the communications frequency channel to the frequency synthesizer to adjust the variable load circuit 22 according to the frequency channel (frequency spectrum) of the pending transmission signal, such that the present invention communications system comprising the variable load circuit can perform similar power amplification of the pending transmission signal over different frequency channels. It is worthy of note that the frequency synthesizer is a necessary component originally found in modern communications systems. The present invention does not require adding a frequency synthesizer to existing art to be realized. In addition, when realizing the variable load circuit 22, a variable inductor could also be adopted, for example, and the variable load circuit 22 could comprise a plurality of impedance elements and corresponding switches for enabling the impedance elements to provide impedance. By controlling the conducting state of each switch, the mapping circuit 28 can adjust the overall impedance provided by the variable load circuit. From the embodiment shown in FIG. 5, the capacitors C1, C2 can be seen as impedance elements, and the switches S1, S2 are corresponding switches. Of course, each impedance element can also be formed with an inductor.

In summary, compared to the tuned amplifier of the prior art, which experiences a tradeoff between bandwidth and gain, the present invention communications system can use a variable load to dynamically adjust to signals on different frequency bands, thereby providing similar power gain for signals on different frequency channels on a wide frequency range.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A mobile system comprising:
    a frequency synthesizer controlled by frequency division data for providing a tuning signal having a frequency corresponding to a frequency of a reference signal and the frequency division data, the mobile system providing an input signal based on the frequency of the tuning signal having a frequency spectrum corresponding to the frequency of the tuning signal; and
    an amplifier module coupled to the frequency synthesizer comprising:
        a variable load circuit for providing an equivalent impedance;
        an amplifier circuit coupled to the variable load circuit for establishing an output signal corresponding to the input signal and the equivalent impedance of the variable load circuit; and
        a mapping circuit for modifying the equivalent impedance of the variable load circuit based on the frequency division data.

2. The mobile system of claim 1, wherein the frequency synthesizer comprises a phase-locked loop (PLL) comprising a frequency divider, the frequency divider used for providing frequency division of the tuning signal based on the frequency division data, the PLL used for adjusting a result of the frequency division of the tuning signal to the frequency of the reference signal.

3. The mobile system of claim 1, wherein the variable load circuit comprises:
    at least an inductor; and a variable capacitor circuit for providing a variable capacitance adjustable by the mapping circuit based on the frequency division data.

4. The mobile system of claim 3, wherein the variable capacitor circuit has a connection port for providing the variable capacitance, the variable capacitor circuit comprises at least one capacitor and one switch corresponding to each capacitor for controlling coupling between the capacitor and the connection port based on a state of the switch, and the mapping circuit controls the state of each switch based on the frequency division data for adjusting the capacitance provided by the variable capacitor circuit.

5. The mobile system of claim 1, wherein the variable load circuit provides the equivalent impedance through the connection port, the variable load circuit comprising at least one impedance module and at least one corresponding switch for controlling coupling between the impedance module and the connection port based on a state of the switch, and the mapping circuit controls the state of the at least one switch based on the frequency division data for adjusting the equivalent impedance provided by the variable load circuit.

6. The mobile system of claim 5, wherein the impedance module includes a capacitor.

7. The mobile system of claim 5, wherein the impedance module includes an inductor.

8. The mobile system of claim 1, wherein a passband of the equivalent impedance corresponds to the frequency spectrum of the input signal based on a frequency domain shift when the mapping circuit adjusts the equivalent impedance of the variable load circuit based on the frequency division data.

9. A method of tuning and amplifying a communications signal based on an input signal for providing an output signal, the method comprising:
setting frequency division data;
performing a frequency synthesis procedure according to the frequency division data using a reference signal to generate a corresponding tuning signal having a frequency corresponding to a frequency of the reference signal and a value of the frequency division data for corresponding a frequency range of the input signal to the frequency of the tuning signal;
performing a mapping procedure according to the value of the frequency division data to provide a corresponding equivalent impedance having a value corresponding to the value of the frequency division data; and
performing a tuning and amplification procedure according to the input signal for establishing the output signal on the equivalent impedance.

10. The method of claim 9, wherein performing the mapping procedure is forming the equivalent impedance with a different number of impedance elements for different values of the frequency division data to correspond the value of the equivalent impedance to the value of the frequency division data.

11. The method of claim 9, wherein performing the mapping procedure is enabling a passband of the equivalent impedance to correspond with the frequency spectrum of the input signal with a shift in the frequency range.

* * * * *